United States Patent
Weltsch et al.

(10) Patent No.: US 10,856,055 B2
(45) Date of Patent: Dec. 1, 2020

(54) APPARATUSES FOR IMPROVED THERMAL PERFORMANCE OF DYNAMIC NETWORK CONNECTIONS

(71) Applicant: Mellanox Technologies, Ltd., Yokneam (IL)

(72) Inventors: Oren Weltsch, Haifa (IL); Alex Kremenetsky, Kiryat Bialik (IL); Alexei Berkovich, Pardes Hana-Karkur (IL); Kfir Katz, Kiryat Tivon (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 9 days.

(21) Appl. No.: 16/359,005

(22) Filed: Mar. 20, 2019

(65) Prior Publication Data

US 2020/0304889 A1    Sep. 24, 2020

(51) Int. Cl.
| | |
|---|---|
| *H05K 7/20* | (2006.01) |
| *G06F 1/20* | (2006.01) |
| *G06F 11/22* | (2006.01) |
| *H04Q 1/02* | (2006.01) |

(52) U.S. Cl.
CPC .......... *H04Q 1/035* (2013.01); *H05K 7/2039* (2013.01); *H05K 7/20772* (2013.01)

(58) Field of Classification Search
CPC .. H04Q 1/035; H05K 7/2039; H05K 7/20772; H05K 7/20; H05K 7/20254; H05K 7/20781; H05K 1/181; H05K 2201/066; H05K 7/20218; H05K 7/20763; H05K 7/20818; G06F 1/20; G06F 1/183; G06F 2200/201; H01B 7/2825
See application file for complete search history.

(56) References Cited

U.S. PATENT DOCUMENTS

| | | | |
|---|---|---|---|
| 6,196,003 B1 * | 3/2001 | Macias | .......... F25B 21/02 |
| | | | 257/E23.082 |
| 2004/0008483 A1 * | 1/2004 | Cheon | .......... G06F 1/20 |
| | | | 361/679.53 |
| 2005/0152663 A1 * | 7/2005 | Bench | .......... G02B 6/4201 |
| | | | 385/147 |
| 2006/0171117 A1 * | 8/2006 | Hamman | .......... F28D 15/00 |
| | | | 361/699 |

(Continued)

*Primary Examiner* — Binh B Tran
*Assistant Examiner* — Michael A Matey
(74) *Attorney, Agent, or Firm* — Alston & Bird LLP (57) ABSTRACT

Apparatuses, systems, and associated methods of manufacturing are described that provide a cooling system for network connections. An example system includes a networking cage assembly that receives a networking cable and a water block that circulates water. The system includes a thermal unit that includes a thermal medium. The thermal medium defines a static end that thermally engages the water block and a dynamic end opposite the static end that is disposed within the networking cage assembly. In an operational configuration in which the networking cable is received by the networking cage assembly, a portion of the dynamic end thermally engages the networking cable so as to dissipate heat from the networking cable to the thermal medium, the thermal medium conducts the heat from the dynamic end to the static end, and the static end dissipates heat from the thermal medium via thermal engagement with the water block.

20 Claims, 7 Drawing Sheets

(56) References Cited

U.S. PATENT DOCUMENTS

| | | | | |
|---|---|---|---|---|
| 2009/0260777 | A1* | 10/2009 | Attlesey | G06F 1/20 165/67 |
| 2010/0103618 | A1* | 4/2010 | Campbell | H05K 7/20236 361/699 |
| 2014/0133101 | A1* | 5/2014 | Sunaga | G06F 1/20 361/699 |
| 2014/0160679 | A1* | 6/2014 | Kelty | G02B 6/4269 361/700 |
| 2015/0013936 | A1* | 1/2015 | MacK | F28D 15/0275 165/53 |
| 2015/0077937 | A1* | 3/2015 | Daly | H04B 10/40 361/700 |
| 2015/0178172 | A1* | 6/2015 | Brodsky | G06F 11/2289 710/16 |
| 2015/0354901 | A1* | 12/2015 | Moore | H01L 23/427 165/104.21 |
| 2016/0136851 | A1* | 5/2016 | Campbell | H05K 7/20436 264/279 |
| 2016/0242318 | A1* | 8/2016 | Krug, Jr. | H05K 7/20772 |
| 2017/0135246 | A1* | 5/2017 | Lunsman | H05K 7/20263 |
| 2017/0181321 | A1* | 6/2017 | Shelnutt | H05K 7/20763 |
| 2017/0261711 | A1* | 9/2017 | Chiang | G02B 6/4267 |
| 2018/0172736 | A1* | 6/2018 | Makinson | G01R 15/146 |
| 2018/0228058 | A1* | 8/2018 | Jiang | G06F 1/20 |
| 2018/0242478 | A1* | 8/2018 | Cui | H05K 7/20772 |
| 2018/0306989 | A1* | 10/2018 | Khazen | G02B 6/4269 |
| 2018/0324984 | A1* | 11/2018 | Marroquin | H05K 7/20254 |
| 2018/0376617 | A1* | 12/2018 | Chen | H05K 7/20272 |
| 2019/0045656 | A1* | 2/2019 | Chen | H05K 7/2039 |
| 2019/0190605 | A1* | 6/2019 | Zhang | H04B 10/40 |
| 2019/0215989 | A1* | 7/2019 | Su | H05K 7/20509 |
| 2019/0239386 | A1* | 8/2019 | Chen | H05K 7/20254 |
| 2019/0246523 | A1* | 8/2019 | Boyden | G06F 1/20 |

* cited by examiner

APPARATUSES FOR IMPROVED THERMAL PERFORMANCE OF DYNAMIC NETWORK CONNECTIONS

TECHNOLOGICAL FIELD

Example embodiments of the present invention relate generally to network connection systems and, more particularly, to systems and apparatuses for improving thermal performance of network connections.

BACKGROUND

Datacenters and other networking systems may include connections between switch systems, servers, racks, and devices in order to provide for signal transmission between one or more of these elements. Such connections may be made using cables, transceivers, networking boxes, printed circuit boards (PCBs), cage receptacles, and connector assemblies, each of which may generate heat during operation. Over time, these systems may experience signal degradation, system component failure, or the like as a result of the heat generated by these components.

BRIEF SUMMARY

Apparatuses, systems, and associated methods are described for improved thermal performance of dynamic network connections. An example cooling system for network connections of the present disclosure may include a networking cage assembly configured to, in an operational configuration, receive a networking cable. The cooling system may further include a networking box that includes a water block configured to receive water circulated therein, and a thermal unit. The thermal unit may include a thermal medium (e.g., a body) defining a static end that is configured to thermally engage the water block of the networking box, and a dynamic end opposite the static end that is disposed within the networking cage assembly. In an operational configuration in which the networking cable is received by the networking cage assembly, at least a portion of the dynamic end is configured to thermally engage the networking cable so as to dissipate heat from the networking cable to the thermal medium, the thermal medium is configured to conduct the heat from the dynamic end to the static end, and the static end is configured to dissipate heat from the thermal medium via thermal engagement with the water block of the networking box.

In some embodiments, the dynamic end may define a first surface configured to thermally engage the networking cage assembly. In such an embodiment, the dynamic end may further define a second surface opposite the first surface configured to be at least partially enclosed by a dynamic base housing. In some cases, the first surface of the dynamic end may be further configured to receive a thermally conductive material disposed thereon such that, in the operational configuration, the thermally conductive material is disposed between the dynamic end of the thermal medium and the networking cable received by the networking cage assembly.

In a further embodiment, the dynamic end of the thermal medium may be dimensioned such that, in the operational configuration in which the dynamic end flexes, thermal engagement with the networking cable is maintained.

In some cases, the static end may define a first surface configured to thermally engage a static base plate of the water block. In such an embodiment, the static base plate may be further configured to receive a thermally conductive material disposed thereon such that, in the operational configuration, the thermally conductive material is disposed between the static base plate and the water block of the networking box. In some cases, the static end may be dimensioned so as to, in the operational configuration, rest upon the static base plate so as to maintain thermal engagement with the water block.

In some embodiments, the dynamic end may define a first cross-section proximate the networking cage assembly and a second cross-section distal the networking cage assembly. The second cross-section may be larger than the first cross-section such that the dynamic end tapers along a length of the thermal medium from the second cross-section to the first cross-section.

In other embodiments, the static end may define a first cross-section proximate the water block and a second cross-section distal the water block. The second cross-section may be larger than the first cross-section such that the static end tapers along a length of the thermal medium from the second cross-section to the first cross-section.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As discussed herein, the example embodiment is illustrated and described with reference to networking cage assembly (e.g., cable receptacle or the like) that is configured to receive a Quad Small Form-factor Pluggable (QSFP) connector as the networking cable. The embodiments of the present disclosure, however, may be equally applicable for use with any connector (e.g., Small Form Pluggable (SFP), C-Form-factor Pluggable (CFP), and the like). Moreover, the embodiments of the present invention may also be used with any cable (e.g., passive copper cable (PCC), active copper cable (ACC), or the like) or interconnect utilized by datacenter racks and associated switch modules (e.g., an active optical module (AOM), QSFP transceiver module, or the like).

As used herein and as would be evident to one of ordinary skill in the art in light of the present disclosure, thermal engagement refers to the ability for heat (e.g., heat energy, thermal energy, etc.) to flow between thermally engaged components. While described herein with reference to physical contact as thermal engagement (e.g., thermal conduction), the present disclosure contemplates that thermal engagement may refer to conduction, convection, radiation, or any heat transfer mechanism between thermally engaged components.

Figure 1:
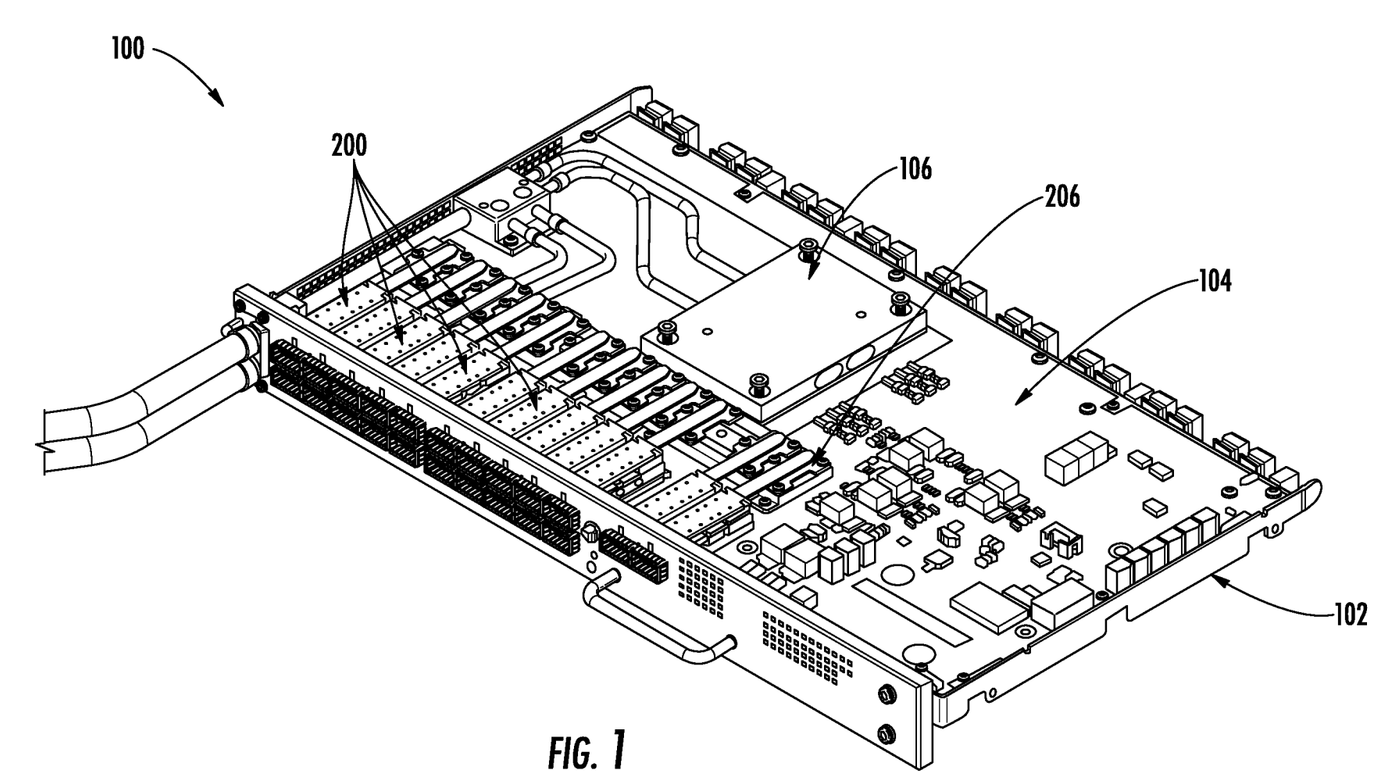
FIG. 1 is a perspective view of a networking box for implementing some example embodiments described herein.

With reference to FIG. 1, a networking system 100 is illustrated for use with some embodiments of the present invention. The networking system 100 may include a networking box 102 that defines or otherwise supports a printed circuit board (PCB) 104, a fluid circulation system 106, and the cooling system 200 of the present disclosure. As shown, the PCB 104 may support or define various electrical and/or optical components that may be used in signal transmission. By way of example, a QSFP (not shown) may be received by the cooling system 200 (via the networking cage assembly described hereafter) and allow for electrical and/or optical signals to be transmitted by the QSFP to one or more components of the PCB 104, and vice versa.

Figure 2:
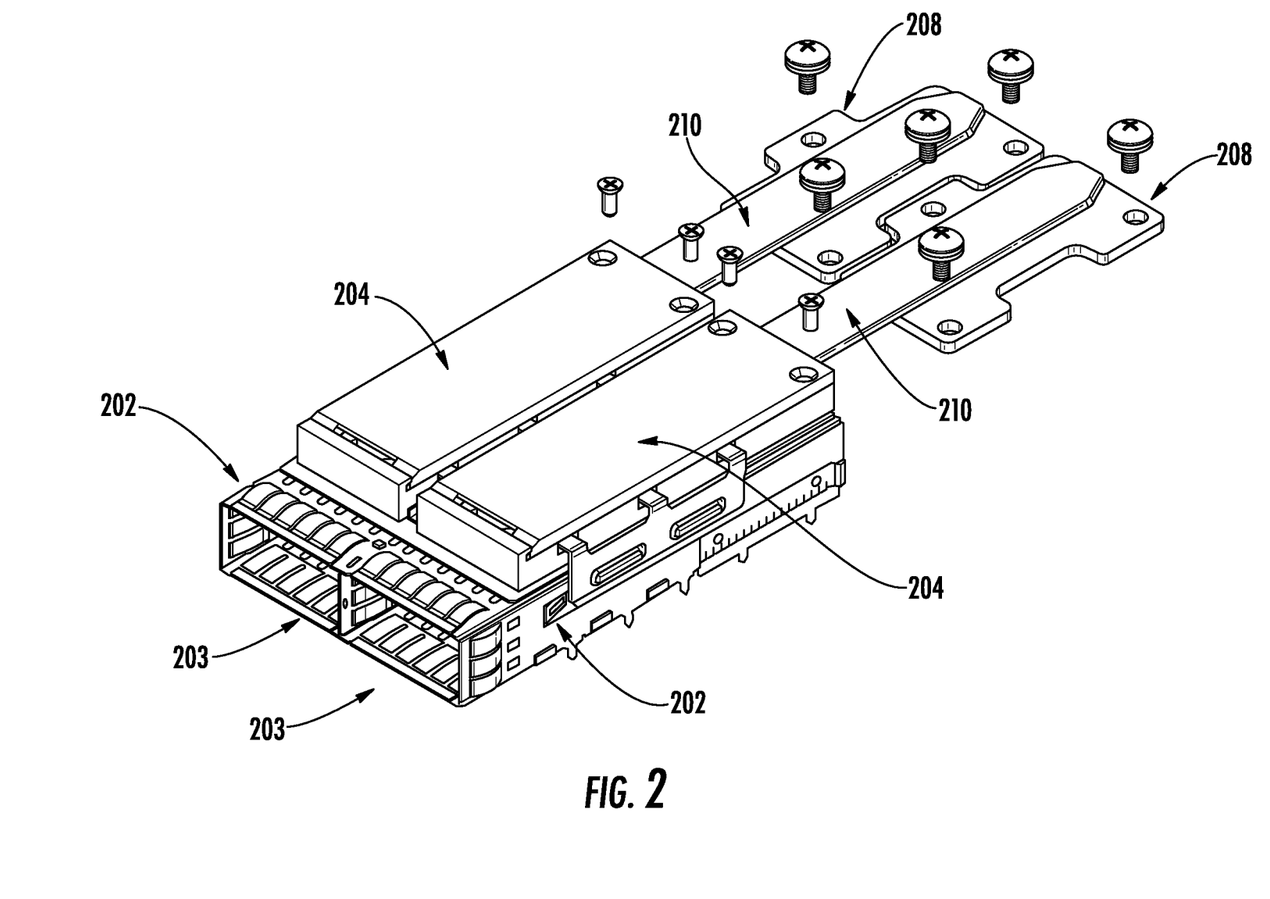
FIG. 2 is a perspective view of a cooling system for network connections according to an example embodiment.

With continued reference to FIG. 1, the networking system 100 may include a fluid circulation system 106 that is configured to facilitate heat dissipation from the networking cable (e.g., QSFP or the like) received by the cooling system 200 (e.g., via a networking cage assembly 202 in FIG. 2). As would be evident to one of ordinary skill in the art in light of the present disclosure, the fluid circulation system 106 may include various fluid conduits (e.g., tubes, pipes, etc.) through which liquid or fluid may flow. Furthermore, the fluid circulation system 106 may include one or more pumps (or equivalent elements) in fluid communication with the various fluid conduits and configured to drive fluid (e.g., water or the like) through the various fluid conduits. As will be described more fully hereafter, the cooling system 200 may include a water block 206 within which fluid driven by the fluid circulation system may circulate. As would be evident to one of ordinary skill in the art in light of the present disclosure, the water block 206 may define a water cooling loop or serpentine path (e.g., spiral, zig-zap, or other pattern) that maximizes the surface area for heat transfer between elements of the cooling system 200 (described hereafter) and the fluid circulated through the cooling loop.

Due to the potential for increased specific heat capacity and thermal conductivity, fluid cooling solutions may be preferable to air cooling solutions (e.g., an air cooled heatsink or the like) in networking solutions. As would be evident to one of ordinary skill in the art in light of the present disclosure, however, traditional systems for fluid cooling fail to provide for connection with dynamic elements. By way of example, QSFPs or other networking cables may be plugged and unplugged from the networking system 100 based upon the intended application, and each connection may require a dynamic connection solution in order to provide effective heat dissipation from the respective QSFP. As such, embodiments of the present invention are directed to cooling systems and associated thermal units that accommodate dynamic connections so as to reduce thermal inefficiencies.

Cooling System and Thermal Unit

With reference to FIG. 2, an example cooling system 200 (e.g., system 200) for network connections is illustrated. As shown, the system 200 includes a networking cage assembly 202, a dynamic base housing 204, a thermal unit 210 (e.g., heat pipe apparatus), and a static base plate 208. As described above, the networking cage assembly 202 may be configured to, in an operational configuration, receive a networking cable (not shown) therein. The networking cage assembly 202 may define an opening 203 through which the networking cable may be inserted into the networking cage assembly 202, and during operation, the networking cable may generate heat that is transferred from the networking cable to the surrounding components described herein. As shown, the cooling system 200 may further include a thermal unit 210 (e.g., heat pipe 210) that thermally connects the networking cage assembly 202 (and networking cable received therein) with the static base plate 208 (and the water block attached thereto). While illustrated in FIG. 2 with two (2) networking cage assemblies 202 each with corresponding thermal units 210, the cooling system 200 of the present disclosure may include any number of networking cage assemblies 202 and thermal units 210 based upon the application of the cooling system 200.

Figure 3:
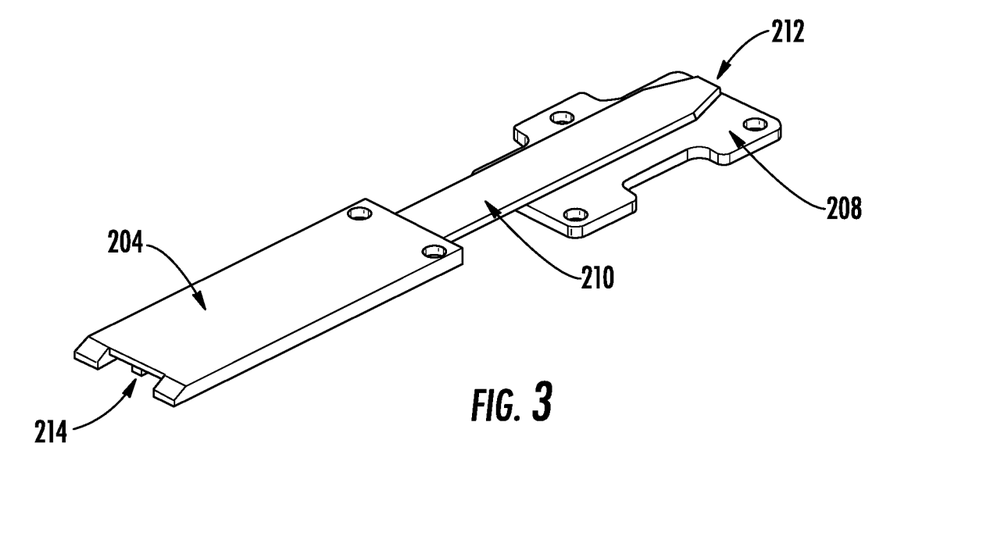
FIG. 3 is a top perspective view of a thermal unit of the cooling system of FIG. 2 according to an example embodiment.
Figure 4:
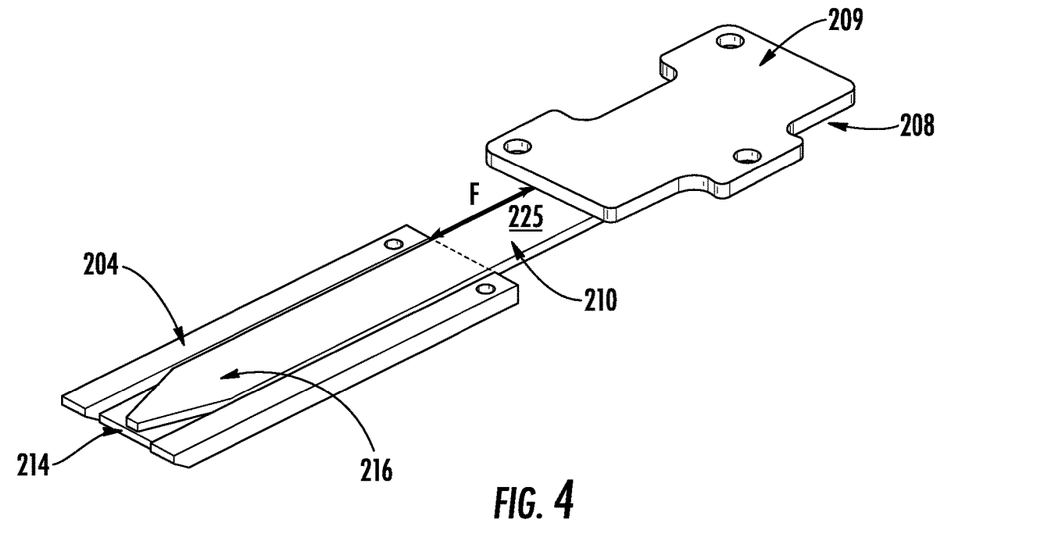
FIG. 4 is a bottom perspective view of the thermal unit of FIG. 3 according to an example embodiment.

With reference to FIGS. 3-4, top and bottom views of the thermal unit 210, respectively, are illustrated. As shown, the thermal unit 210 may define a static end 212 that is configured to thermally engage a water block (e.g., the water block 206 in FIG. 1). The static end 212 may be positioned so as to, in some embodiments, rest upon the static base plate 208. In other alternative embodiments, the static end 212 may be housed with or otherwise secured to the base plate 208 so as to provide thermal engagement between these elements. As would be evident to one of ordinary skill in the art in light of FIGS. 3-4, the static end 212 of thermal unit 210 may remain substantially in the same position or static during operation (in an instance in which the networking cage assembly 202 receives a networking cable). As such, thermal engagement between the static end 212 and the static base plate 208 also remains substantially constant during operation. While the static end 212 is illustrated as a tapered elongate element (as described hereafter) that contacts a substantially flat static base plate 208, the present disclosure contemplates that the static end 212 and static base plate 208 may be dimensioned (e.g., sized and shaped) based upon the intended application and to comply with relevant industry standards.

With continued reference to FIG. 4, the thermal unit 210 may further define a dynamic end 214 that is opposite the static end 212 and disposed within the networking cage assembly 202 via a dynamic base housing 204. As shown, the dynamic base housing 204 may define a slot, channel, etc. that receives the dynamic end 214 of the thermal unit 210 therein. The dynamic end 214 of the thermal unit 210 may be configured to thermally engage a networking cable (not shown) that is received by the networking cage assembly 202. As would be evident to one of ordinary skill in the art in light of the present disclosure, however, the position of the dynamic end 214 may change during operation in response to receipt of the networking cable (not shown) by the networking cage assembly 202. For example, in operation, the networking cable may contact the dynamic end 214 and cause the dynamic end 214 to flex within the dynamic base housing 204. Despite the flexion of the dynamic end 214, embodiments of the present invention allow for continuous thermal engagement between the dynamic end 214 and the networking cable. While the dynamic end 214 is illustrated as a tapered elongate element (as described hereafter) that is disposed within a channeled dynamic base housing 204 (shown in FIG. 4), the present disclosure contemplates that the dynamic end 214 and the dynamic base housing 204 may be dimensioned (e.g., sized and shaped) based upon the intended application and to comply with relevant industry standards.

Figure 5:
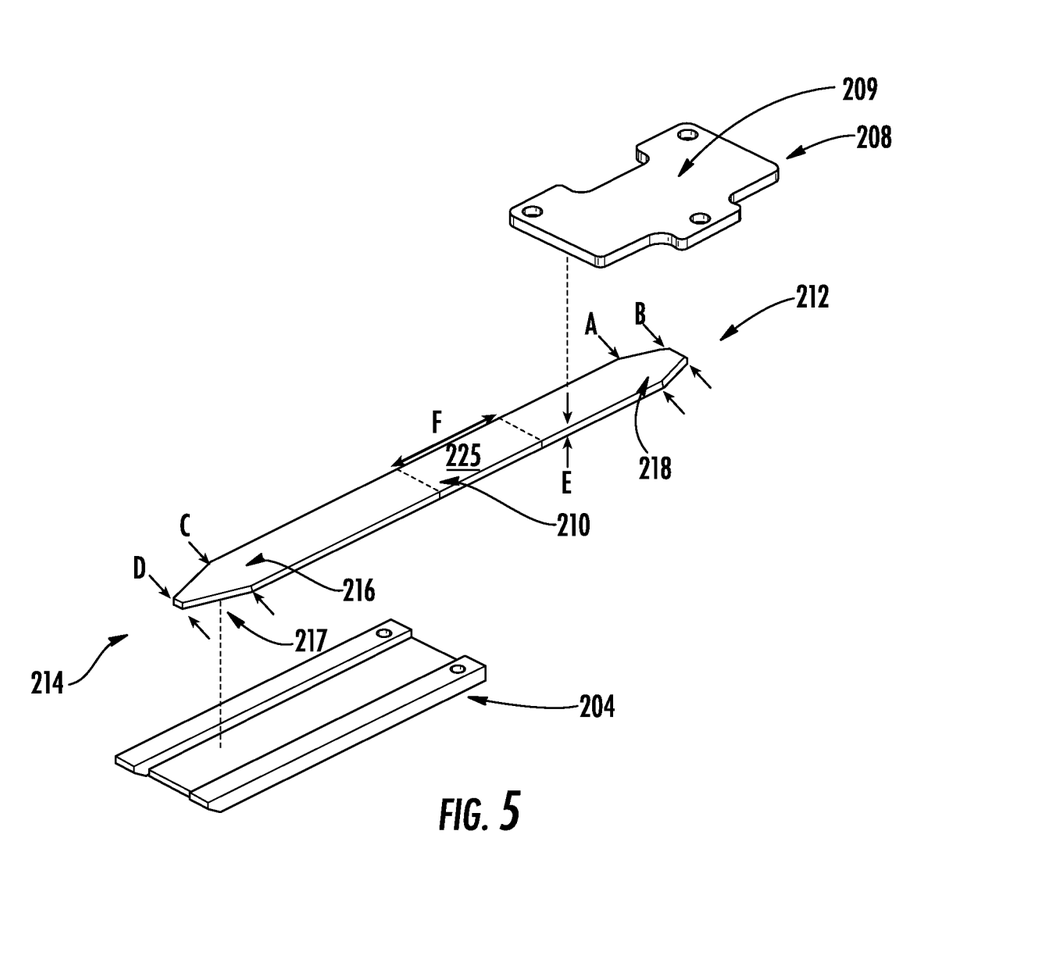
FIG. 5 is an exploded view of an example thermal unit according to an example embodiment.

With reference to FIG. 5, an exploded view of the thermal unit 210, the dynamic base housing 204, and the static base plate 208 is illustrated. As shown, the static end 212 may further define a first surface 218 that is configured to thermally engage the static base plate 208. Similarly, the static base plate 208 may define a first surface 209 that is configured to thermally engage the water block of the networking box (e.g., the water block 206 in FIG. 1). As would be evident to one of ordinary skill in the art in light of the present disclosure, the first surface 218 and the first surface 209 may each be substantially planar so as to maximize the surface area contact between the static end 212, the static base plate 208, and the water block (e.g., the water block 206 in FIG. 1). As would be evident to one of ordinary skill in the art in light of the present disclosure, in some instances, the dynamic end 214 may refer to the thermal unit evaporator side while the static side 212 may refer to the thermal unit condenser side. While described herein with reference to the dynamic side 214 and the static side 212, the present disclosure contemplates that these sides may be reversed or otherwise changed from one implementation to another based upon the configuration and intended application of the implementation. Said differently, the dynamic side 214 and the static side 212 of the thermal unit 210 may be substantially identical in mechanical structure such that operation of the dynamic side 214 and the static side 212 are determined by their respective connection within the cooling system 200.

With continued reference to FIG. 5, the dynamic end 214 may further define a first surface 216 that is configured to thermally engage the networking cage assembly 202 and the networking cable received therein. In some embodiments, the networking cage assembly 202 and the dynamic end 214 may be configured such that the dynamic end 214, in the operational configuration, is in direct contact with at least a portion of the networking cable so as to maximize the heat transferred from the networking cable to the dynamic end 214. Furthermore, the dynamic end may define a second surface 217 that is opposite the first surface 216. The second surface may be configured to be at least partially enclosed by the dynamic base housing 204. As described above, the dynamic base housing 204 may, for example, define a slot, channel, or the like that is configured (e.g., sized and shaped) to receive the dynamic end 214. During operation in which the networking cable contacts the dynamic end 214 and causes the dynamic end 214 to flex, the dynamic base housing 204 and associated slot may allow the dynamic end 214 to move while maintaining thermal engagement with the networking cable.

During operation, a networking cable may be received by the networking cage assembly 202 so as to transmit optical and/or electrical signals to the networking box 102. Components of the networking cable (e.g., circuitry, optical receivers, optical emitters, transducers, transceivers, or the like) may generate heat during operation. As described above, at least a portion of the dynamic end 214 of the thermal unit 210 may be configured to thermally engage (e.g., via continuous contact) the networking cable so as to dissipate heat from the networking cable to the thermal medium of the thermal unit 210. The thermal medium of the thermal unit 210 may be configured to conduct the heat from the dynamic end 214 to the static end 212 (e.g., away from the components of the networking cable). The static end 212 may be configured to dissipate heat from the thermal medium of the thermal unit 210 via thermal engagement with the water block 206 of the networking box 102. For example, due to the circulation of fluid within the water block 206 as described above with reference to FIG. 1, the heat may be transmitted from the water block 206 to the fluid that circulates therein. In this way, the cooling system 200 of the present application provides for improved thermal performance of dynamic connections such as those with networking cables.

With continued reference to FIG. 5, in some embodiments, the thermal unit 210 may be dimensioned (e.g., sized and shaped) as an elongate body such the distance between the dynamic end 214 and the static end 212 is substantially larger than the thickness E of the body. By providing a substantially thin, elongate body (e.g., thermal medium) for the thermal unit 210, the acceptable movement between the dynamic end 214 and the static end 212 is increased. Furthermore, in some embodiments, the dynamic end 214 may define a first cross-section D proximate the networking cage assembly 202 and a second cross-section C distal the networking cage assembly 202. The second cross-section C may be larger than the first cross-section D, such that the dynamic end 214 tapers along a length of the thermal medium of the thermal unit 210 from the second cross-section C to the first cross-section D. Similarly, in some embodiments, the static end 212 may define a first cross-section B proximate the water block 206 and a second cross-section A distal the water block 206. The second cross-section A may be larger than the first cross-section B such that the static end 212 tapers along a length of the thermal medium of the thermal unit 210 from the second cross-section A to the first cross-section B.

As illustrated in FIGS. 4-5, the thermal unit 210 may further define a free portion 225 located between the static end 212 and the dynamic end 214 having a length F. As would be evident to one of ordinary skill in the art in light of the present disclosure, the free portion 225 may refer to a free length (e.g., a length F) of the thermal unit 210 that is not supported by the dynamic base housing 204 nor the static base plate 208. The free portion 225 of the thermal unit 210 may provide the requisite flexibility to allow for the movement of the thermal unit 210 during operation. As would be evident to one of ordinary skill in the art in light of the present disclosure, as the length F of the free portion 225 increases, the flexibility of the thermal unit 210 increases while the thermal performance of the thermal unit 210 decreases. Conversely, as the length F of the free portion 225 decreases, the flexibility of the thermal unit 210 decreases while the thermal performance of the thermal unit 210 increases. As such, in some embodiments, the length F of the free portion 225 and the thickness E of the thermal unit may be adjusted so as to optimize the mechanical operation of the system while also providing sufficient thermal performance. In some embodiments, for example, the length F of the free portion may be at least 9 mm. In some further embodiments, the thickness E of the thermal unit 210 may be at least 0.9 mm. Still further, in some embodiments, the ratio of the length F and the thickness E may be at least 8 to 1 (e.g., a length that is at least 8 times as large as the thickness).

Figure 6:
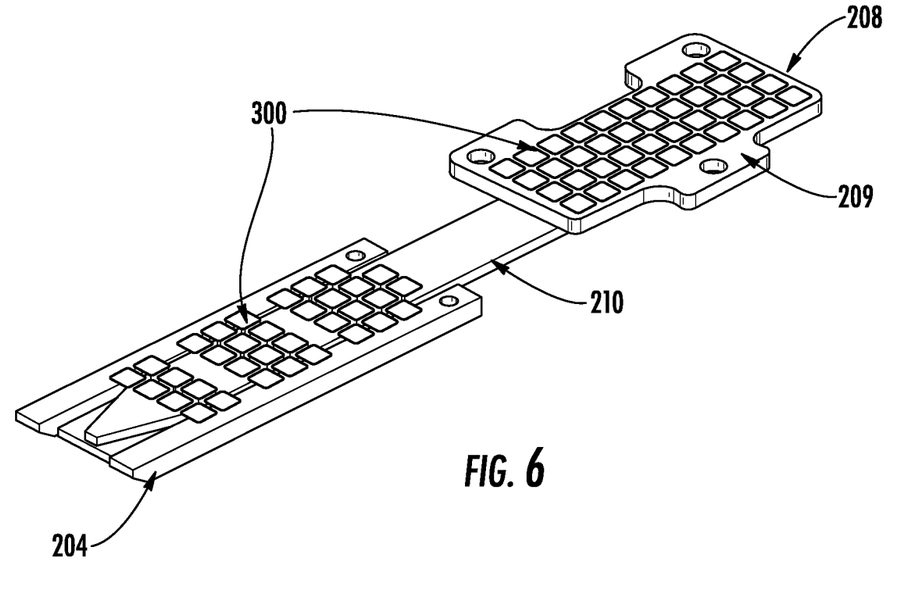
FIG. 6 is an assembled view of the thermal unit of FIG. 5 including thermal conductive material.

With reference to FIG. 6, an assembled view of the thermal unit 210 is illustrated. As shown in FIGS. 5 and 6, in some embodiments, the first surface 216 of the dynamic end 214 may be configured to receive a thermally conductive material 300 disposed thereon. The thermally conductive material, in the operational configuration, may be disposed between the dynamic end 214 of the thermal medium of the thermal unit 210 and the networking cable received by the networking cage assembly 202. Similarly, in some embodiments, the static base plate 208 may be configured to receive a thermally conductive material 300 disposed thereon. In the operational configuration, the thermally conductive material 300 may be disposed between the static base plate 208 and the water block 206 of the networking box 102. As would be evident to one of ordinary skill in the art, the thermally conductive material 300 (e.g., thermal grease, heat paste, thermal gel, thermal paste, thermal compound, etc.) may be used to increase the thermal efficiency (e.g., maximize heat transfer) between the networking cable and the dynamic end 214 and between the static base plate 208 and the water block 206.

Example Method of Manufacture

Figure 7:
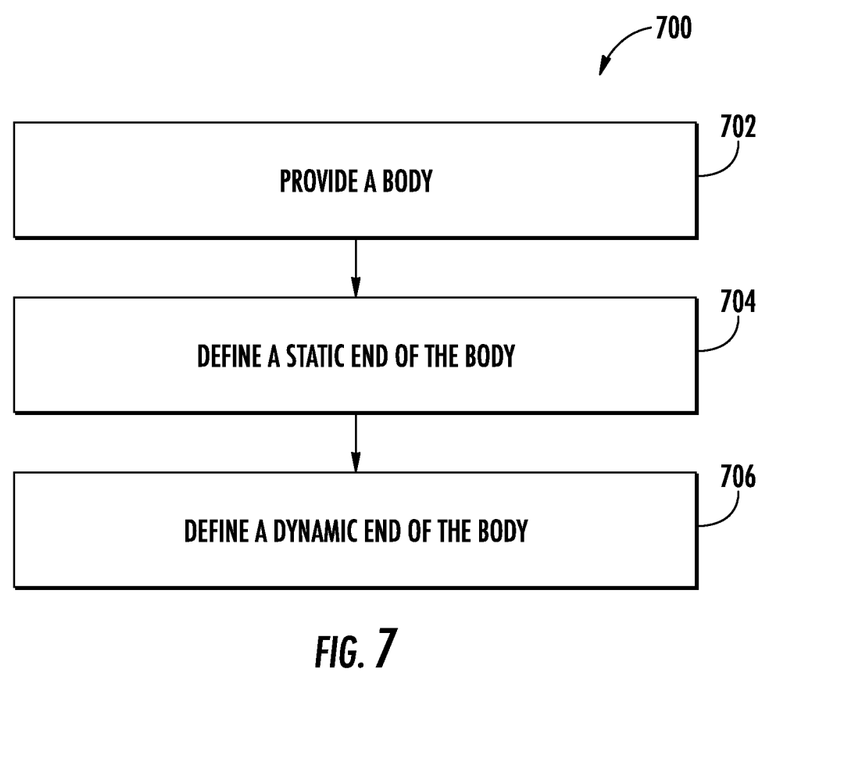
FIG. 7 is a flowchart illustrating a method of manufacturing a thermal unit according to an example embodiment.

With reference to FIG. 7, a method of manufacturing a thermal unit according to embodiments of the invention is illustrated. The method (e.g., method 700) may include the step of providing a thermal medium at Block 702. As described above, the thermal medium of the thermal unit 210 may be an elongate body (e.g., thermal medium) such that the distance between the ends of the body are substantially larger than the thickness E of the body. Furthermore, the thermal medium may be configured to thermally connect the networking cage assembly (and the networking cable received therein) to the static base plate (and the water block attached thereto). Due to the thermal considerations described above, embodiments of the present application contemplate that the thermal medium of the thermal unit may be formed of a thermally conductive material (e.g., copper, copper heat pipe, graphite sheet, or the like), but note that any material that provides for heat transfer between ends of the thermal medium may be used based upon the intended application.

The method 700 may also include defining a static end of the thermal medium at Block 704. As described above, the static end may be defined such that, when resting upon a static base plate, it provides thermal engagement between these elements. In some embodiments, defining the static end may further include defining a first cross-section B proximate the water block and a second cross-section A distal the water block. The second cross-section A may be larger than the first cross-section B such that the static end tapers along a length of the thermal medium of the thermal unit from the second cross-section A to the first cross-section B. As would be evident to one of ordinary skill in the art, the static end may be dimensioned (e.g., sized and shaped) based upon the intended application and to comply with relevant industry standards.

The method 700 may also include defining a dynamic end of the thermal medium at Block 706. As described above, the dynamic end may be defined opposite the static end and configured to be disposed within the networking cage assembly via a dynamic base housing. The dynamic end of the thermal unit may be defined so as to thermally engage a networking cable that is received by the networking cage assembly. In some embodiments, defining the dynamic end 214 may include defining a first cross-section D proximate the networking cage assembly and a second cross-section C distal the networking cage assembly. The second cross-section C may be larger than the first cross-section D such that the dynamic end tapers along a length of the thermal medium of the thermal unit from the second cross-section C to the first cross-section D. As would be evident to one of ordinary skill in the art in light of this disclosure, the dynamic end may also be dimensioned (e.g., sized and shaped) based upon the intended application and to comply with relevant industry standards.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A cooling system for network connections, the system comprising:
 a networking cage assembly configured to, in an operational configuration, receive a networking cable;
 a networking box, wherein the networking box comprises a water block defining a cooling loop configured to receive water circulated therein; and
 a thermal unit comprising:
  a thermal medium comprising an elongate body, the body defining:
   a static end, wherein the static end is configured to thermally engage the water block of the networking box; and
   a dynamic end opposite the static end, wherein the dynamic end is disposed within the networking cage assembly,
  wherein, in an operational configuration in which the networking cable is received by the networking cage assembly, at least a portion of the dynamic end is configured to thermally engage the networking cable so as to dissipate heat from the networking cable to the thermal medium, the thermal medium is configured to conduct the heat from the dynamic end to the static end, and the static end is configured to dissipate heat from the thermal medium via thermal engagement with the water block of the networking box.

2. The cooling system according to claim 1, wherein the dynamic end defines a first surface configured to thermally engage the networking cage assembly.

3. The cooling system according to claim 2, wherein the dynamic end further defines a second surface opposite the first surface configured to be at least partially enclosed by a dynamic base housing such that the dynamic base housing limits perpendicular movement of the dynamic end with respect to the networking cage assembly.

4. The cooling system according to claim 3, wherein the dynamic end of the thermal medium is dimensioned such that, in the operational configuration in which the dynamic end flexes, thermal engagement with the networking cable is maintained.

5. The cooling system according to claim 2, wherein the first surface of the dynamic end is further configured to receive a thermally conductive material disposed thereon such that, in the operational configuration, the thermally conductive material is disposed between the dynamic end of the thermal medium and the networking cable received by the networking cage assembly.

6. The cooling system according to claim 1, wherein the static end defines a first surface configured to thermally engage a static base plate of the water block.

7. The cooling system according to claim 6, wherein the static base plate is further configured to receive a thermally conductive material disposed thereon such that, in the operational configuration, the thermally conductive material is disposed between the static base plate and the water block of the networking box.

8. The cooling system according to claim 6, wherein the static end is dimensioned so as to, in the operational configuration, rest upon the static base plate so as to maintain thermal engagement with the water block.

9. The cooling system according to claim 1, wherein the dynamic end defines a first cross-section proximate the networking cage assembly and a second cross-section distal the networking cage assembly, and wherein the second cross-section is larger than the first cross-section such that the dynamic end tapers along a length of the thermal medium from the second cross-section to the first cross-section.

10. The cooling system according to claim 1, wherein the static end defines a first cross-section proximate the water block and a second cross-section distal the water block, and wherein the second cross-section is larger than the first cross-section such that the static end tapers along a length of the thermal medium from the second cross-section to the first cross-section.

11. A thermal unit for use in networking connections, the thermal unit comprising:
a thermal medium comprising an elongate body, the body defining:
a static end, wherein the static end is configured to thermally engage a water block of a networking box defining a cooling loop configured to receive water circulated therein; and
a dynamic end opposite the static end, wherein the dynamic end is disposed within a networking cage assembly,
wherein, in an operational configuration in which a networking cable is received by the networking cage assembly, at least a portion of the dynamic end is configured to thermally engage the networking cable so as to dissipate heat from the networking cable to the thermal medium, the thermal medium is configured to conduct the heat from the dynamic end to the static end, and the static end is configured to dissipate heat from the thermal medium via thermal engagement with the water block of the networking box.

12. The thermal unit according to claim 11, wherein the dynamic end defines a first surface configured to thermally engage the networking cage assembly.

13. The thermal unit according to claim 12, wherein the dynamic end further defines a second surface opposite the first surface configured to be at least partially enclosed by a dynamic base housing such that the dynamic base housing limits perpendicular movement of the dynamic end with respect to the networking cage assembly.

14. The thermal unit according to claim 13, wherein the dynamic end of the thermal medium is dimensioned such that, in the operational configuration in which the dynamic end flexes, thermal engagement with the networking cable is maintained.

15. The thermal unit according to claim 12, wherein the first surface of the dynamic end is further configured to receive a thermally conductive material disposed thereon such that, in the operational configuration, the thermally conductive material is disposed between the dynamic end of the thermal medium and the networking cable received by the networking cage assembly.

16. The thermal unit according to claim 11, wherein the static end defines a first surface configured to thermally engage a static base plate of the water block.

17. The thermal unit according to claim 16, wherein the static end is dimensioned so as to, in the operational configuration, rest upon the static base plate so as to maintain thermal engagement with the water block.

18. The thermal unit according to claim 11, wherein the dynamic end defines a first cross-section proximate the networking cage assembly and a second cross-section distal the networking cage assembly, and wherein the second cross-section is larger than the first cross-section such that the dynamic end tapers along a length of the thermal medium from the second cross-section to the first cross-section.

19. The thermal unit according to claim 11, wherein the static end defines a first cross-section proximate the water block and a second cross-section distal the water block, and wherein the second cross-section is larger than the first cross-section such that the static end tapers along a length of the thermal medium from the second cross-section to the first cross-section.

20. A method of manufacturing a thermal unit, the method comprising:
providing a thermal medium comprising an elongate body;
defining a static end of the thermal medium, wherein the static end is configured to thermally engage a water block of a networking box defining a cooling loop configured to receive water circulated therein; and
defining a dynamic end of the thermal medium opposite the static end, wherein the dynamic end is configured to be disposed within a networking cage assembly,
wherein, in an operational configuration in which a networking cable is received by the networking cage assembly, at least a portion of the dynamic end is configured to thermally engage the networking cable so as to dissipate heat from the networking cable to the thermal medium, the thermal medium is configured to conduct the heat from the dynamic end to the static end, and the static end is configured to dissipate heat from the thermal medium via thermal engagement with the water block of the networking box.

\* \* \* \* \*